(12) United States Patent
Nam et al.

(10) Patent No.: US 8,704,601 B2
(45) Date of Patent: Apr. 22, 2014

(54) CLASS E POWER AMPLIFIER

(75) Inventors: Sang Wook Nam, Seoul (KR); Yong Hoon Song, Seoul (KR); Sung Ho Lee, Seoul (KR); Jae Jun Lee, Gyeonggi-do (KR); Eun Il Cho, Seoul (KR)

(73) Assignee: SNU R&DB Foundation, Seoul (KR)

( * ) Notice: Subject to any disclaimer, the term of this patent is extended or adjusted under 35 U.S.C. 154(b) by 34 days.

(21) Appl. No.: 13/516,230

(22) PCT Filed: Dec. 15, 2010

(86) PCT No.: PCT/KR2010/008977
§ 371 (c)(1),
(2), (4) Date: Jun. 14, 2012

(87) PCT Pub. No.: WO2011/074873
PCT Pub. Date: Jun. 23, 2011

(65) Prior Publication Data
US 2012/0319782 A1    Dec. 20, 2012

(30) Foreign Application Priority Data
Dec. 15, 2009 (KR) .................. 10-2009-0125138

(51) Int. Cl.
*H03F 3/04* (2006.01)
(52) U.S. Cl.
USPC ............................................ 330/310; 330/98
(58) Field of Classification Search
USPC ................................... 330/310, 311, 98, 150
IPC ................................................... H03F 3/2176
See application file for complete search history.

(56) References Cited

U.S. PATENT DOCUMENTS

| 5,023,566 | A | 6/1991 | El-Hamamsy et al. |
| 6,320,468 | B2 * | 11/2001 | Carroll et al. ................. 330/286 |
| 6,737,923 | B2 * | 5/2004 | Yamamoto et al. ........... 330/302 |
| 7,250,820 | B2 * | 7/2007 | Meck ............................. 330/297 |
| 7,265,618 | B1 * | 9/2007 | Meck ............................. 330/251 |
| 7,612,616 | B2 * | 11/2009 | Deng et al. .................... 330/302 |
| 8,014,719 | B2 * | 9/2011 | Moloudi et al. ................ 455/20 |

FOREIGN PATENT DOCUMENTS

| EP | 1580879 A2 | 9/2005 |
| JP | 07-170129 | 7/1995 |
| JP | 08-124685 | 5/1996 |

OTHER PUBLICATIONS

Tsai, et al., A 1.9-GHz, 1-W CMOS Class-E power amplifier for wireless communications, IEEE Journal of Solid-State Circuits, vol. 34, pp. 962-970, Jul. 1999.

(Continued)

*Primary Examiner* — Henry Choe
(74) *Attorney, Agent, or Firm* — Husch Blackwell LLP

(57) ABSTRACT

The present invention includes a class-E power amplifier, comprising a driver stage (DS) including a first power amplifier with transistors, to which an input signal is inputted; a main stage (MS), including a second power amplifier with transistors, whose input is connected to the output of the DS; and a first LC resonator whose one end is connected to the output of the DS and the other end to the ground as an AC equivalent circuit and a second LC resonator whose one end is connected to the input of the MS and the other end to the ground as an AC equivalent circuit. In accordance with the present invention, as the voltage stress is reduced on the CMOS class-E power amplifier, the application of the high power supply voltage may be allowed and therefore the load impedance may be high while the same efficiency is maintained.

15 Claims, 14 Drawing Sheets

(56) References Cited

OTHER PUBLICATIONS

Jang, et al., A CMOS RF power amplifier using an off-chip transmision line transformer with 62% PAE, IEEE Microwave and Wireless Components Letters, vol. 17, No. 5, pp. 385-387, May 2007.

Mertens, et al., A 700-MHz, 1-W fully differential CMOS class-E power amplifier, IEEE Journal of Solid-State Circuits, vol. 37, No. 2, pp. 137-141, Feb. 2002.

Brama, et al., A 30.5 dBm 48% PAE CMOS class-E PA with integrated balun for RF applications, IEEE Journal of Solid-State Circuits. vol. 43, No. 8, pp. 1755-1762, Aug. 2008.

* cited by examiner

CLASS E POWER AMPLIFIER

CROSS REFERENCE TO RELATED APPLICATIONS

This application is a U.S. National Phase Application of International Application PCT Application No. PCT/KR2010/008977 filed on Dec. 15, 2010, which claims the benefit of priority from Korean Patent Application No. 10-2009-0125138 filed on Dec. 15, 2009. The disclosures of International Application PCT Application No. PCT/KR2010/008977 and Korean Patent Application No. 10-2009-0125138 are incorporated herein by reference.

FIELD OF THE INVENTION

The present invention relates to a class-E power amplifier; and more particularly, to a CMOS class-E power amplifier which improves overall efficiency and guarantees reliability with (i) harmonic-controlling double resonance circuit that reduces voltage stress on transistors and (ii) negative capacitance which compensates for surplus capacitance from the drain of the transistor.

BACKGROUND OF THE INVENTION

Recently, thanks to the development of telecommunication technology, mobile terminals, etc. are widely used. Such mobile terminals demand a high efficiency of transmitting RF signals. For the transmission of RF signals, the power amplifier which consumes the largest portion of DC power may be handled as the critical component to determine overall RF transmitter efficiency. Accordingly, power amplifiers with a high efficiency are necessary to improve overall efficiency In general, class-E power amplifiers are more widely used due to benefits such as high efficiency and simplicity of realization. The class-E power amplifier was introduced by Sokal in 1975 and experimented by Raab. In more detail, as a kind of switching amplifier, it may achieve ideal 100% drain (or collector) efficiency by shaping a voltage waveform and a current waveform. So far, circuit designs for new devices, such as As HBTs, GaN HEMTs, and InP DHBTs (Double HBTs), used to operate on higher frequency ranges and microwave with higher RF performances have been actively developed. Recently, researches have been conducted about watt-level output power amplifiers using CMOS technology on microwave frequency ranges to reduce costs.

The CMOS power amplifier may reduce design costs but bring several problems. One of the problems is a low breakdown voltage. As a process scale becomes smaller, the breakdown voltage is also reduced. As the result, power supply voltage is limited to avoid breakdowns. To deliver a wide range of output power under the low power supply voltage condition, it is inevitable to reduce load impedance. But this causes efficiency degradation and a narrowband load matching network.

Additionally, the CMOS power amplifier needs to reduce on-resistance for high efficiency and to drive sufficient currents for watt-level output power. Therefore, it requires a wide gate width. The maximum operating frequency $f_{MAX}$ of the class-E power amplifier is proportional to peak drain current $I_{MAX}$. Accordingly, the gate width cannot but reach some millimeters. Even though the gate width is widened, this causes parasitic elements such as parasitic capacitance. The parasitic capacitance increases shunt drain capacitance $C_P$, which limits the normal operation condition because the maximum operating frequency $f_{MAX}$ of the class-E power amplifier is determined by an $I_{MAX}/C_P$ ratio. When the shunt drain capacitance $C_P$ deviates from the optimal value determined by the condition of the class-E power amplifier operation due to the parasitic capacitance, etc., the efficiency degradation occurs.

SUMMARY OF THE INVENTION

It is an object of the present invention to solve all the problems mentioned above.

It is another object of the present invention to avoid breakdowns by implementing a double resonance circuit of a CMOS class-E power amplifier for harmonic control and reduce voltage stress on transistors by controlling voltage waveforms applied to the gate of the power amplifier and therefore to allow higher power supply voltage to be applied and get same efficiency even at a higher load impedance.

It is still another object of the present invention not only to deliver higher output power but also to minimize interference with other circuits in operation by applying a differential configuration, instead of a single ended configuration, to the CMOS class-E power amplifier.

In accordance with one aspect of the present invention, there is provided a class-E power amplifier, including a driver stage (DS) including a first power amplifier with transistors, to which an input signal is inputted; a main stage (MS), including a second power amplifier with transistors, whose input is connected to the output of the DS; and a first LC resonator whose one end is connected to the output of the DS and the other end to the ground as an AC equivalent circuit and a second LC resonator whose one end is connected to the input of the MS and the other end to the ground as an AC equivalent circuit.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 1:
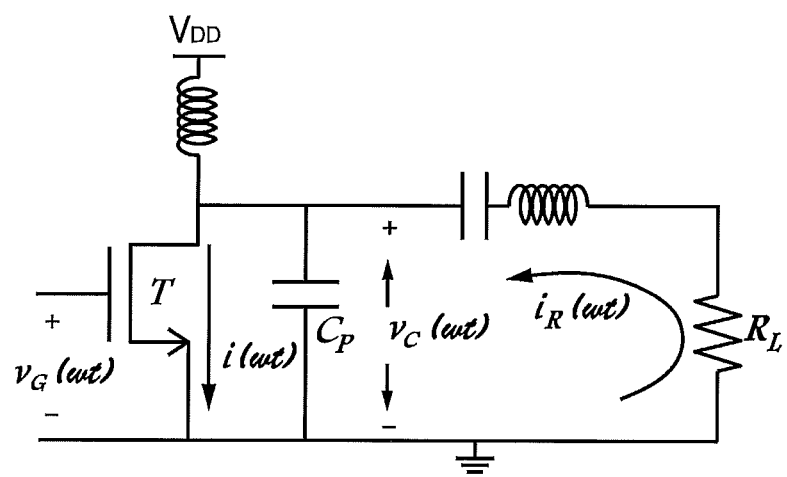
FIG. 1 is a schematic diagram illustrating a basic configuration of a common class-E power amplifier.

The detailed description of the present invention illustrates specific embodiments in which the present invention can be performed with reference to the attached drawings.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

The configurations of the present invention for accomplishing the objects of the present invention are as follows:

Ahead of describing the technology relating to the features of the present invention, the basic configuration and operation of a class-E power amplifier as the technical field of the present invention is explained as shown below.

Class-E Power Amplifier

FIG. 1 is a schematic diagram showing a basic configuration of a basic class-E power amplifier.

By referring to FIG. 1, the common class-E power amplifier may include a switch, a shunt capacitor $C_P$ which is connected in parallel with the switch, and load resistor $R_L$. In addition, one or more lumped elements with certain impedance, e.g., a capacitor and an inductor, may be connected in series with load resistor $R_L$, where a transistor T may be a CMOS transistor.

At the time, the current $i_R$ flowing along the loop made by the shunt capacitor $C_P$ and the load resistor $R_L$ or the loop made by the shunt capacitor $C_P$, the load resistor $R_L$ and other elements connected in series with the load resistor $R_L$ may be expressed as in the following equation:

$$i_R(\omega t) = I_R \sin(\omega t + \phi) \quad \text{Equation 1}$$

In addition, the voltage $v_C(\omega t)$ on the transistor T and the current $i(\omega t)$ flowing through the transistor T may be stated in the following Equations 2 and 3:

$$v_C(\omega t) = -\frac{I_R}{\omega C_P}[\cos(\omega t + \varphi) + \cos\varphi + (\omega t - \pi)\sin\varphi] \quad \text{Equation 2}$$

$$i(\omega t) = I_R[\sin(\omega t + \phi) - \sin\phi] \quad \text{Equation 3}$$

The operation of the class-E power amplifier is the charging or discharging of the capacitor $C_P$ according to an operating signal, where $v_C(\omega t)$ satisfies two following conditions: i) zero voltage switching (ZVS) which prevents the dissipation of the energy stored in the capacitor $C_P$ when it is on and ii) zero voltage derivative switching (ZVDS) which makes the circuit less influenced even over the environment where elements, frequency, switching period and the like are changing. Under the circumstance where the class-E power amplifier has a 50% duty cycle (the transistor is on for $0 \le \omega t < \pi$, and off for $\pi \le \omega t < 2\pi$), the value of $\phi$ becomes $-32.482°$. Accordingly, Equations 2 and 3 may be written in a standard form by the following Equations 4 and 5:

$$\frac{v_C(\omega t)}{V_{DD}} = \pi\left[\omega t - \frac{3\pi}{2} - \frac{\pi}{2}\cos(\omega t) - \sin(\omega t)\right] \quad \text{Equation 4}$$

$$\frac{i(\omega t)}{I_0} = \frac{\pi}{2}\sin(\omega t) - \cos(\omega t) + 1 \quad \text{Equation 5}$$

where $V_{DD}$ in Equations 4 and 5 is the power supply voltage of the class-E power amplifier as illustrated in FIG. 1 and $I_0 = -I_R \sin(\phi)$.

The class-E power amplifier operated with the waveforms expressed by Equations 4 and 5 achieve 100% drain (or collector) efficiency in theory because it does not cause DC losses by overlapping $V_C(\omega t)$ and $i(\omega t)$ in operation. The relationship among the operating frequency, the capacitor $C_P$ and the load resistor $R_L$ may be explained by a relation such as $\omega C_P R_L = 0.1836$ in the theoretical class-E power amplifier.

In the real environment, variation in the capacitance value of the desirable capacitor, however, may occur depending on parasitic capacitance or process variation in the CMOS process. Therefore, when the load resistor $R_L$ is fixed in a given frequency, the $\omega C_P R_L$ value cannot be maintained as 0.1836. When the $\omega C_P R_L$ value deviates from 0.1836, the class-E power amplifier comes to have a loss, which reduces drain (or collector) efficiency.

Another feature of the class-E power amplifier is to have a high-peak voltage swing. When the power supply voltage is $V_{DD}$ under the operating conditions, the maximum voltage $V_{MAX}$ on the drain (or collector) of the transistor T is described as in the following Equation 6:

$$V_{MAX} = -2\pi\phi V_{DD} = 3.562 V_{DD}$$

where the maximum voltage $V_{MAX}$ gives influence over the reliability of the transistor T. In particular, the breakdown voltage of the CMOS transistor cannot but be reduced. To avoid breakdown, there is no way but to limit the maximum voltage $V_{MAX}$.

To solve the problems, the present invention implements a double resonance circuit to the class-E power amplifier to thereby secure the reliability of the circuit and reduce voltage stress on the transistor.

The class-E power amplifier in accordance with one example embodiment of the present invention is explained in detail below.

First, the double resonance circuit included in the class-E power amplifier in accordance with one example embodiment of the present invention is explained at large.

Double Resonance Circuit

Figure 2A:
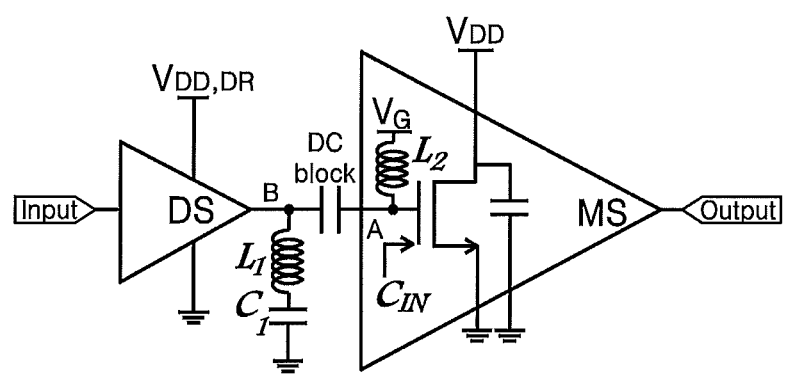
FIG. 2A is a schematic diagram exemplarily illustrating a configuration of the class-E power amplifier with a double resonance circuit in accordance with one example embodiment of the present invention.
Figure 2B:
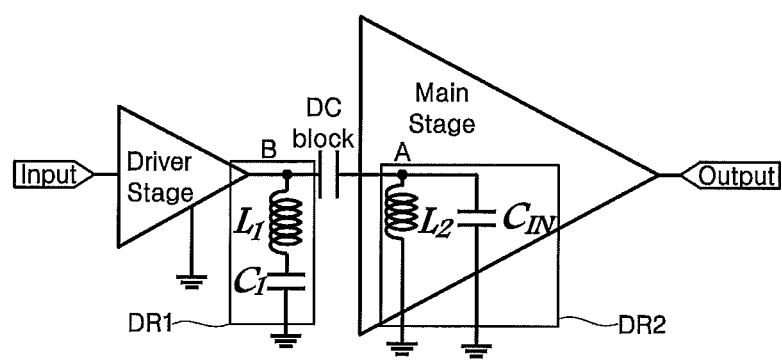
FIG. 2B is a schematic diagram of an AC equivalent circuit of the schematic diagram illustrated in FIG. 2A.

FIG. 2A exemplarily illustrates a schematic diagram implementing the double resonance circuit in the class-E amplifier in accordance with one example embodiment of the present invention and FIG. 2B is a schematic diagram of an AC equivalent circuit of the schematic diagram illustrated in FIG. 2A.

The double resonance circuit may form specific voltage waveforms at a node A, i.e., a gate of the transistor included in the power amplifier, which may be performed through harmonic control. Because the output of the power amplifier driven in a switching mode may be formed appropriately in driving the class-E power amplifier, the voltage waveform at a node B may be applied by a switching mode driver stage (DS). Accordingly, the power amplifier driven in the switching mode operates in a non-linear region, of which output waveform includes many harmonics. When the output signal of the DS is applied to the main stage (MS), there exists only a DC-bias difference between the output node B of the DS and the input node A of the MS. The waveform of node A may be expressed as shown in Equation 7.

$$v_G(\omega t) = a_0 + a_1 \sin(\omega t) + a_2 \sin(2\omega t) + a_3 \sin(3\omega t) + a_4 \sin(4\omega t) + \quad \text{Equation 7}$$

where $a_i$ in Equation 7 represents the coefficient of i-th harmonic.

The resonance frequencies of the double resonance circuit are fundamental frequency and a second harmonic. The double resonance circuit penetrates the fundamental frequency and a third harmonic from the DS to the MS and removes a second harmonic. In short, it performs the operation to reduce even harmonics and penetrate odd harmonics. The waveform of the voltage $v_G$ in accordance with the control of the harmonic, i.e., the waveform with the even harmonic being reduced, is as illustrated in FIG. 3.

Figure 3:
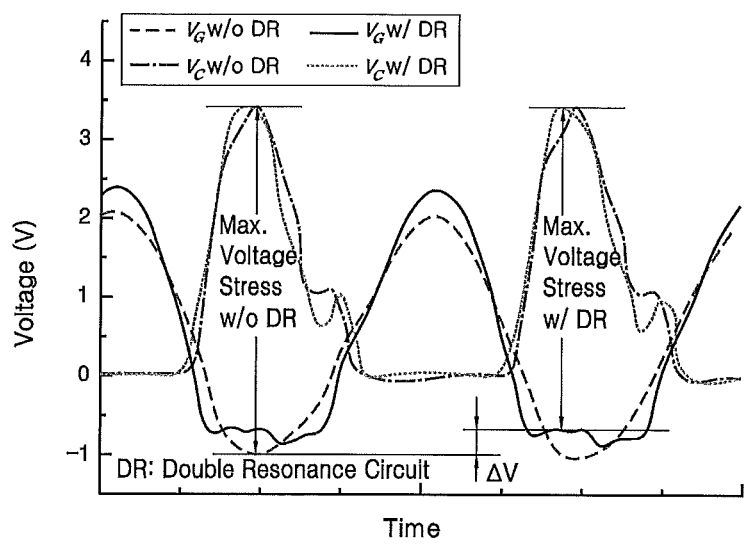
FIG. 3 is a graph showing the waveforms of input voltage, output voltage and voltage stress reduction of the class-E power amplifier with the double resonance circuit in accordance with one example embodiment of the present invention.

When the threshold voltage of each transistor is 0.5 V and the power supply voltage $V_{DD}$ is 1.0 V and the duty cycle is maintained fixedly, $v_G$, $v_C$, and $\Delta V$ In FIG. 3 represent the input voltage, the output voltage and the reduction of voltage stress of the class-E power amplifier with the double resonance circuit as illustrated FIG. 2.

By referring to FIG. 3, when the switch is off, the voltage of transistor drain (or collector) included in the MS reaches the peak valve, theoretically 3.562 $V_{DD}$ in a 50% duty cycle, and the highest voltage stress is applied to the gate oxygen. When the double resonance circuit is applied, the DC offset of the voltage $v_G$ is increased and when it is off, the voltage $v_G$ does not fall much below the threshold voltage of the transistor while the duty cycle is not reduced. Consequently, the maximum voltage stress of the transistor may be reduced by the high voltage $v_G$ during the off state.

The formation of the voltage obtained through the harmonic control by the double resonance circuit differs from DC-bias increasing. The latter changes the duty cycle of the power amplifier and drain (or collector) peak voltages change according to the changed duty cycle. When the duty cycle increases, the peak voltage also increases, and it worsens the voltage stress on the transistor. However, voltage shaping through harmonic control exhibits the same duty cycle in a fixed threshold voltage of the transistor, e.g., 0.5 V and allows the power amplifier to maintain the same performance.

The double resonance circuit using harmonic control in accordance with one example embodiment of the present invention relieves the transistor from breakdown through voltage stress reduction. Particularly, in the CMOS class-E power amplifier with 1.0 V power supply voltage, the voltage stress is reduced by 0.3 V from 4.3 V to 4.0 V. Furthermore, the removal of the second harmonic and the penetration of odd harmonics make the rising and falling time of the waveform of the voltage $v_G$ faster to help the operation of the switching power amplifier.

Again, by referring to FIG. 2B, the present invention used two resonators to implement the double resonance circuit. One of them is a series LC resonator DR1, connected to the output node B of the DS, which includes an inductor $L_1$ and a capacitor $C_1$ connected in series. The other one is a shunt LC resonator DR2 which includes a gate inductor $L_2$ and the input capacitor of the MS $C_{IN}$. The input capacitor $C_{IN}$ is an equivalent capacitance component viewed from the input of the MS to the MS. The parts indicated in two boxes in FIG. 2B represent the series LC resonator DR1 and the shunt LC resonator DR2.

The shunt LC resonator DR2 is designed to resonate at the fundamental frequency to overcome large input capacitance and effectively drive the main power amplifier and the series LC resonator DR1 is designed to block the second harmonic and penetrate the fundamental frequency and the third harmonic at the node B. By the double resonance circuit, the transistor included in the MS is relieved from breakdown and secures margins enough to increase the power supply voltage $V_{DD}$ in the main stage. When the power supply voltage of the power amplifier is increased with the same load resistor, the greater power may be outputted. For the reason, when the power supply voltage becomes higher, the performance of the power amplifier may be improved. Since the power supply voltage $V_{DD}$ may be increased in accordance with the present invention, as described above, the performance of the power amplifier may be improved. In the CMOS power amplifier with watt-level output power, the load impedances, furthermore, are generally a few ohms. Consequently, the impedance transformer must have a higher rate of transformation. As the high power supply voltage $V_{DD}$ may be applied by using the double resonance circuit in accordance with the present invention, the high load impedance may be applied for high efficiency at the same output power.

Negative capacitance included in the class-E power amplifier in accordance with one example embodiment of the present invention is explained below.

Negative Capacitance

Before the explanation on the negative capacitance, shunt capacitance of the class-E power amplifier illustrated in FIG. 1 is described.

1. Shunt Capacitance

As explained above, when the $\omega C_P R_L$ value deviates from the optimal value of the class-E power amplifier illustrated in FIG. 1, efficiency declines and the relationship between $\phi$ and $\omega C_P R_L$ may be expressed as shown in the equation below.

$$\varphi = \frac{1}{2}\left[\sin^{-1}\left(\frac{\omega C_P R_L}{\sqrt{\frac{1}{4}+\frac{4}{\pi^2}}}\right) - \tan^{-1}\left(\frac{4}{\pi}\right)\right] \quad \text{Equation 8}$$

As known in Equation 8, the inverse relationship between φ and $\omega C_P R_L$ is established. When $\omega C_P R_L$ increases from 0.1836, φ declines and the drain voltage of the transistor has a positive value at ωt=2π. When $\omega C_P R_L$ decreases from 0.1836, φ increases and the drain voltage of the transistor has a negative value at ωt=2π.

Figure 4:
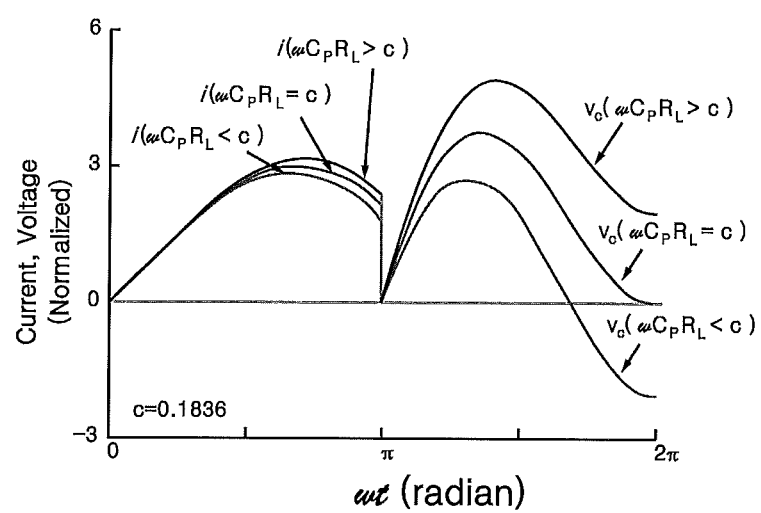
FIG. 4 is a graph showing the waveforms of transistor drain voltage and current of the common class-E power amplifier according to change of values of $\omega C_P R_L$.

The waveforms of the transistor drain voltage $v_C$ and the current i flowing through the transistor depending on the change of the $\omega C_P R_L$ value are as illustrated in FIG. 4. FIG. 4 is a graph representing the waveforms of the standardized drain voltage $v_C$ and current i of the class-E power amplifier for a single cycle when 50% duty cycle is applied in accordance with the present invention.

By referring to FIG. 4, it may be known that the transistor is on for 0≤ωt<π and off for π≤ωt<2π. When the ZVS circumstance is not satisfied, i.e., when $\omega C_P R_L$ is not 0.1836, the voltage and current waveforms are overlapped from the starting point of the next cycle because the transient time is required to have zero voltage between the transistor drain and source. The transition time results in a loss during a finite time. Accordingly, it is desirable to maintain fixed values $R_L$ and $C_P$ as the optimal values for the high efficiency at a given frequency in the class-E amplifier.

Based on the explanation of the shunt capacitance, the negative capacitance is explained below.

2. Negative Capacitance

Figure 5A:
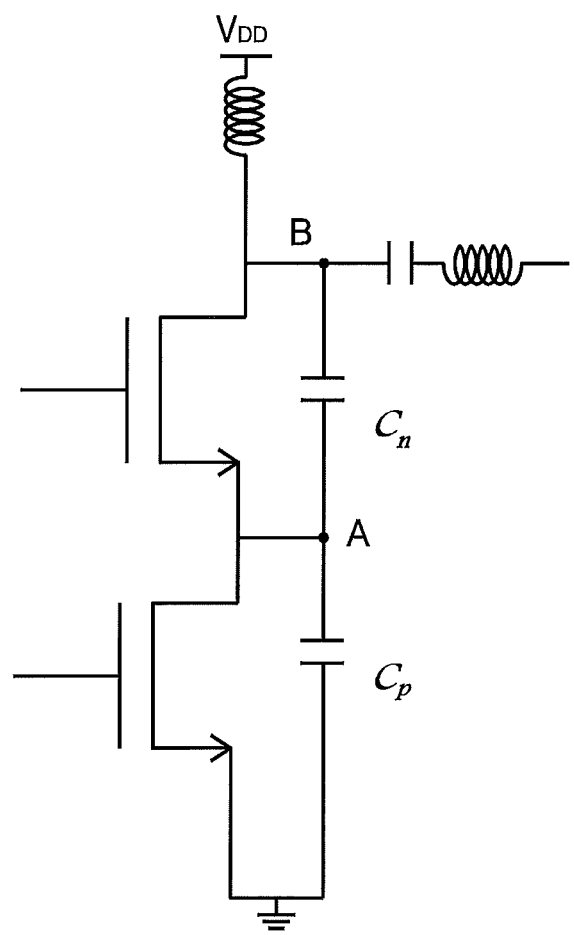
FIG. 5A is a schematic diagram which realizes negative capacitance to part of the class-E power amplifier in accordance with one example embodiment of the present invention.
Figure 5B:
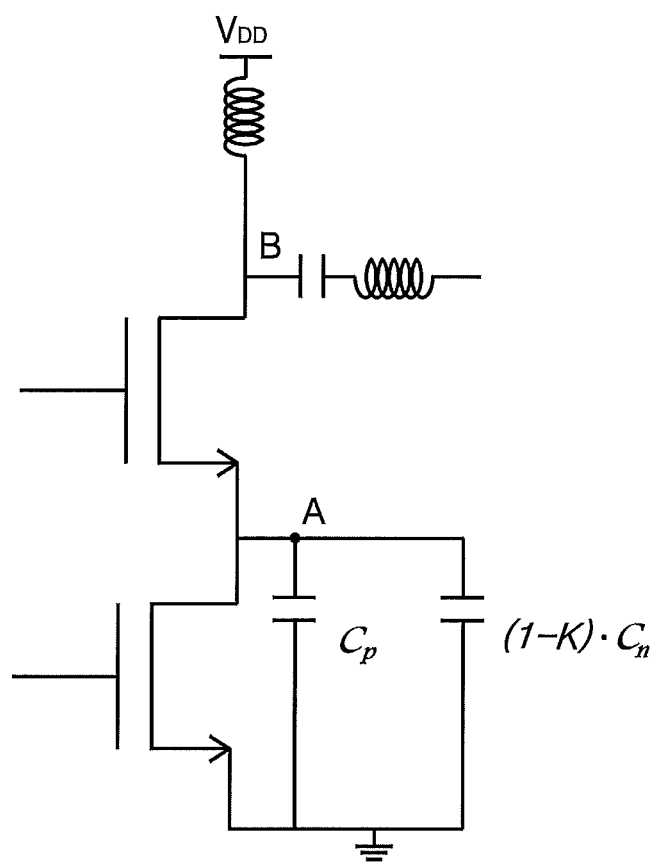
FIG. 5B is a schematic diagram of an AC equivalent circuit of the schematic diagram illustrated in FIG. 5A.

FIG. 5A is a schematic diagram which realizes negative capacitance and FIG. 5B is a schematic diagram of an AC equivalent circuit of the schematic diagram illustrated in FIG. 5A.

In the field of the CMOS power amplifier illustrated in FIGS. 5A and 5B, gate widths are desirable to be widen because they must deliver the watt-level output power. The gate widths are some millimeters and this transistor may include picofarad F capacitance on the drain node. This adds parasitic capacitance on the shunt drain capacitor $C_P$ and therefore, the capacitance value $C_P$ becomes larger than the ideal optimal value and this causes the reduction of the drain efficiency. In addition, it is desirable to take the cascode topology in the class-E power amplifier to secure reliability. This results in high-peak voltage. The additional common gate (CG) power amplifier due to the application of the cascode topology usually has a large gate width and this also reduces on-resistance and increases the capacitance value of the capacitor $C_P$. Accordingly, in order to control the reduction of the efficiency, compensation for surplus capacitance which is generated as the capacitance value of the capacitor $C_P$ increases is more significant.

The surplus capacitance should be compensated to keep the optimal $C_P$ value. One of the methods used to remove the surplus capacitance is to place an indicator on the same node with a DC block (Refer to FIG. 2). However, there is a drawback that a wider area is required to place the inductor to implement it into an integrated circuit. Besides, another drawback is that the inductor includes parasitic components such as parasitic capacitance or parasitic resistance and has a low quality factor or Q factor. In the present invention, therefore, a configuration of placing negative capacitance components in a cascode topology, instead of placing inductance components, is applied to remove the surplus capacitance components. In other words, negative capacitor $C_n$ between node A and node B is placed for the serial relationship with the capacitor $C_P$ in FIG. 5A.

Basically, the negative capacitance value plays the same role as polarity-inversed Miller capacitance. In FIG. 5A, the negative capacitor $C_n$ may be equalized as the Miller capacitor $C_M$ in FIG. 5B. Miller capacitance is stated as in the equation 9.

$$C_M = (1-K) \cdot C_n \quad \text{Equation 9}$$

where K indicates the voltage gain of the nodes of the negative capacitor $C_n$. K usually becomes negative. Miller capacitor $C_M$ increases the capacitance as much as $(1-K)C_n$. As such, since negative capacitance $C_n$ is connected between the input and the output CG power amplifier, which has positive gain K, it is possible to get the same effect as the Miller capacitor $C_M$ on node A as illustrated in FIG. 5B. The negative capacitor $C_n$ compensates for surplus capacitance on node A and adjusts the capacitance value of the capacitor $C_P$ to the optimal value, thereby guaranteeing the performance of the class-E power amplifier operation.

The negative capacitance implemented by using the capacitor provides several benefits to the CMOS power amplifier. First, it is easy to maintain optimal performance because the capacitor at the implementation requires a smaller space than the inductor and has a higher Q factor with relatively less parasitic components. Second, it is possible to be turned on or off with the switch because it is disposed in parallel with the switch implemented as the transistor. Besides, it may be implemented with a small value thanks to the increase of the value as much as a gain of the CG power amplifier, e g., K.

In FIGS. 5A and 5B, the parasitic capacitance on node B may not be as much of concern as that of node A because the value of node B is smaller than that of node A. In addition, since the CG power amplifier operates while it is always on to reduce on-resistance, most of the capacitor charging or discharging occurs at node A. Therefore, the negative capacitance is enough only to be used to compensate for the parasitic capacitance value at node A.

Now, an actual design circuit of the class-E power amplifier in accordance with one example embodiment of the present invention is depicted below.

Configuration of Design Circuit

Figure 6:
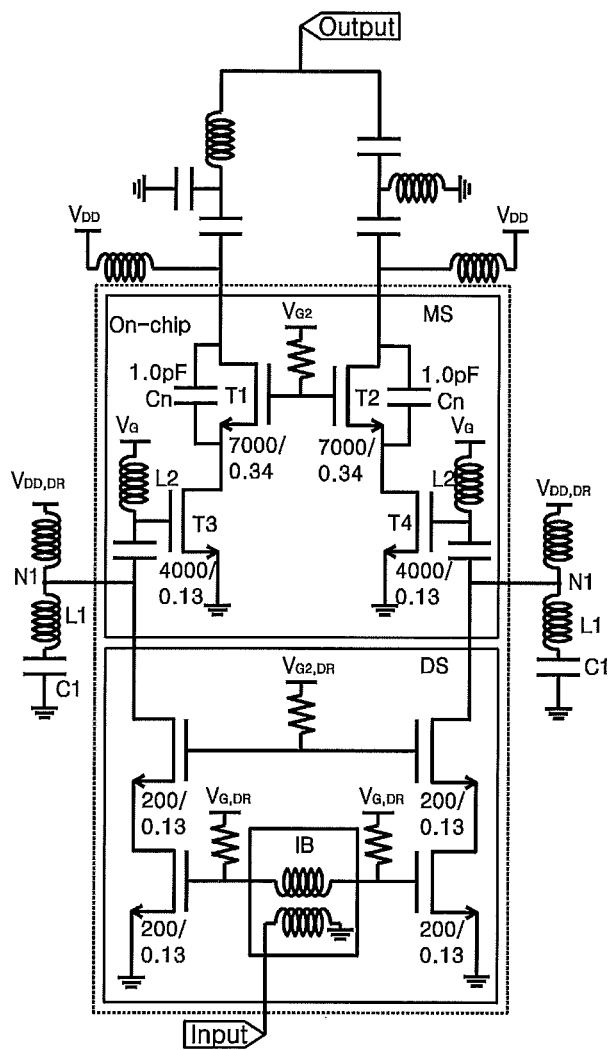
FIG. 6 is a schematic diagram of an overall configuration of the class-E power amplifier in accordance with one example embodiment of the present invention.
Figure 7:
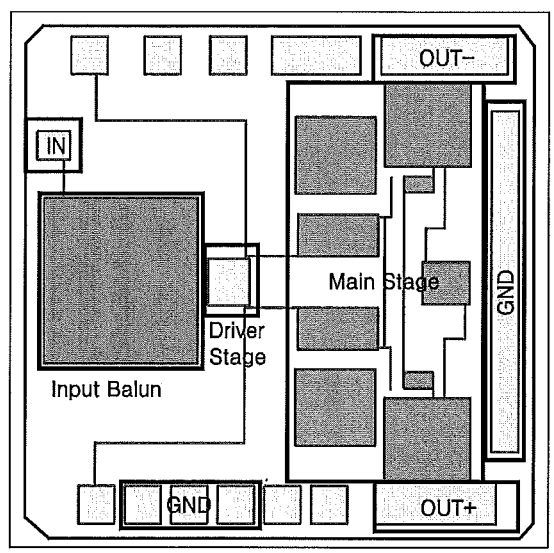
FIG. 7 is a diagram showing the actual image of a chip implementing the CMOS class-E power amplifier in accordance with one example embodiment of the present invention.

FIG. 6 illustrates a schematic diagram of an overall configuration of the class-E power amplifier in accordance with one example embodiment of the present invention and FIG. 7 shows the actual image of a chip implementing the CMOS class-E power amplifier.

First, a configuration of the main stage (MS) included in the design circuit of the class-E power amplifier in accordance with one example embodiment of the present invention is explained.

1. Main Stage (MS)

The class-E power amplifier has voltage stress due to high peak voltage on the transistor, e.g., CMOS transistor. As explained above, because the cascode structure may divide large output voltage swing into transistors connected in series, it is desirable to design the MS circuit in the cascode structure as illustrated in FIG. 6 to avoid breakdown.

By referring to FIG. 6, the MS may include one or more CG power amplifiers and one or more common source (CS) power amplifiers. The CG power amplifier and the CS power amplifier may include the cascode structure and one or more cascode structures form a differential configuration.

In the schematic diagram illustrated in FIG. 6, a thin gate-oxide transistors, T3 and T4, for the CS power amplifier and thick gate-oxide transistors, T1 and T2, for the CG power amplifier were used to guarantee the highest performance. For example, the thin gate-oxide transistor may be a transistor which has a 0.13 µm gate length for 1.2 V power supply voltage and the thick gate-oxide transistor may have a 0.34 µm gate length for 3.3 V power supply voltage. When RF performance is improved, the complexity of the power amplifier may be alleviated and this may bring higher operation efficiency. For the reason that the thin gate-oxide transistor produces better RF performance and has lower on-resistance than the thick gate-oxide transistor, the combination of the thin gate-oxide transistor and the thick gate-oxide transistor as described above is more desirable than that of two thick gate-oxide transistors.

In addition, several parasitic components, e.g., drain capacitance, which increase the value of the capacitor $C_P$ (Refer to FIG. 5), are included in the circuit. To reduce them, the transistors with specified gate widths may be used for the CS power amplifier. For an instance, as illustrated in FIG. 6, 4000 µm gate width transistors may be used.

Moreover, it is desirable to use the thick gate-oxide transistor for the CG power amplifier because wide voltage swing is applied. The use of the thick gate-oxide transistor may avoid breakdown and keep the state on due to on-bias all the time and also may keep high efficiency by reducing on-resistance. For example, 7000 µm gate width transistors may be used for the CG power amplifier.

Next, the configuration of the driver stage (DS) included in the design circuit of the class-E power amplifier in accordance with one example embodiment of the present invention is described in detail.

2. Driver Stage (DS)

As illustrated in FIG. 6, the DS in accordance with one example embodiment of the present invention may include one or more CS power amplifiers and one or more CG power amplifiers. The CG power amplifier and the CS power amplifier may include the cascode structure and one or more cascode structures form a differential configuration.

Because the output of the class-E power amplifier shows a large voltage swing, it may drive the power amplifier fully only with low power supply voltage. When the low power supply voltage is applied to the power amplifier, a DC power loss is reduced and therefore the decrease in efficiency, i.e., drain efficiency (DE) and power added efficiency (PAE), may be lowered. Furthermore, the double resonance circuit may be considered to design load impedance of the DS. In fact, the difference between DE and PAE in the DS illustrated in FIG. 6 is only 3% to 4%.

To avoid breakdown, it is desirable to place the thick gate-oxide transistors of the DS on the cascode topology as shown in FIG. 6. For example, 200 µm gate width transistors such as T5, T6, T7, and T8, may be used.

Furthermore, as illustrated in FIGS. 6 and 7, a transformer may be used as an input balun (IB) by being connected to the gate of the CS transistor. The configuration of the transformer must be changed from a single-ended structure to a differential one to drive differential amplifiers.

Described below is the double resonance circuit included in the design circuit of the class-E power amplifier in accordance with one example embodiment of the present invention.

3. Double Resonance Circuit

As shown above, the voltage waveform at the input of the main power amplifier included in the MS may be comprised by the double resonance circuit. The double resonance circuit may include a first resonator and a second resonator. The former is placed at output node N1 of the driving power amplifier and it is implemented as a series LC resonator containing an inductor L1 and a capacitor C1 which are connected in series. The series LC resonator eliminates the second harmonic from a signal flowing at the input node of the main power amplifier and penetrates the third harmonic to the main power amplifier included in the MS. Besides, the second resonator may include an inductor L2 connected to the gate of the main power amplifier. The inductor L2 resonates with the input capacitance $C_{IN}$ of the main power amplifier (Refer to FIG. 2) at the resonance frequency.

The double resonance circuit reduces voltage stress on the CS power amplifier implemented with the thin gate-oxide transistor disposed in the form of the cascode structure in the main stage and forms the voltage waveform without deteriorating the performance and duty cycle of the power amplifier. As the result of the simulation of the circuit shown in FIG. 6, the voltage stress was relieved by 0.2 V from the CMOS transistor.

Next, the negative capacitor $C_n$ connected to the input and output of the MS is presented.

4. Negative Capacitance

As presented above, the negative capacitor $C_n$ plays a role in restoring the value to the optimal value by compensating for the surplus capacitance on the drain capacitor $C_P$ of the transistor included in the MS. As shown in FIG. 6, the capacitor $C_n$ may be implemented by properly connecting the capacitor with a prefixed value between the drain and source of the CG transistor included in the MS.

Since the capacitor $C_n$ provides a feedback path on the CG power amplifier in the MS, when the capacitance value of $C_n$ becomes larger, it is difficult to secure stability. As explained above, thanks to the CG power amplifier gain, e.g., K, even though the capacitance value of $C_n$ is small, the capacitor is possible to play a role fully as a negative capacitor. For example, a 1.0 pF capacitor $C_n$ was used in FIG. 6. According to the result of the actual simulation, it was found out that even though the capacitor $C_n$ is inserted, stability is not impaired. Besides, the negative capacitor $C_n$ compensated for roughly 10.0 pF surplus capacitance and PAE was enhanced by roughly 6%.

The explanation of the actual operation characteristics and performance of the designed class-E power amplifier in accordance with one example embodiment of the present invention is as follows:

Operation Characteristics and Performance of Class-E Power Amplifier

The inventor implemented the power amplifier including the DS and the IB as illustrated in FIGS. 6 and 7 by using the standard CMOS process with gate dimension of 0.13 µm. As shown in FIG. 7, the die area of the chip, including the bonding pads, was 1.0 mm². To minimize the effect from the change in bonding inductance, multiple bonding pads were used. Totally 12 pads were used to thereby reduce ground resistance and provide heat sink for the power amplifier. Off-chip passive components were implemented on an FR4 printed circuit board (PCB).

Figure 8:
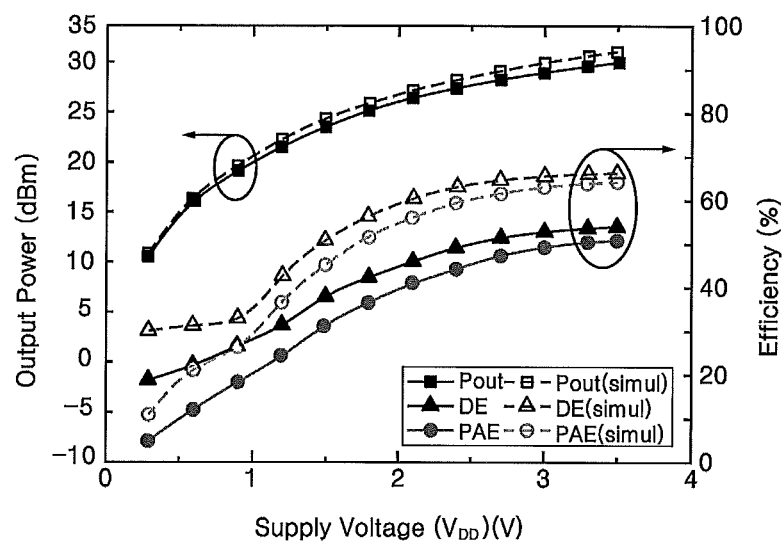
FIG. 8 is a graph representing the measured and simulated results of output power, drain efficiency, and power added efficiency of the class-E power amplifier against its power supply voltage in accordance with one example embodiment of the present invention.

FIG. 8 is a graph representing the measured and simulated results of output power, drain efficiency, and power added efficiency of the class-E power amplifier against its power supply voltage in accordance with one example embodiment of the present invention and the operating frequency was set to be 1.8 GHz.

By referring to FIG. 8, while the gate bias of the CG power amplifier is 2.5 V in sweep mode, the power supply voltage $V_{DD}$ varies from 0.3 V to 3.5 V. When the power supply voltage $V_{DD}$ is 3.5 V, the output power $P_{out}$ of 31.5 dBm, DE of 54% and PAE of 51% were measured. While the power supply voltage $V_{DD}$ is changing from 3.3 V to 3.5 V, the output power was measured to increase by 0.4 dB. During the measurement process, the input signal was set as 6.5 dBm and a 25 dB power gain was obtained.

Figure 9:
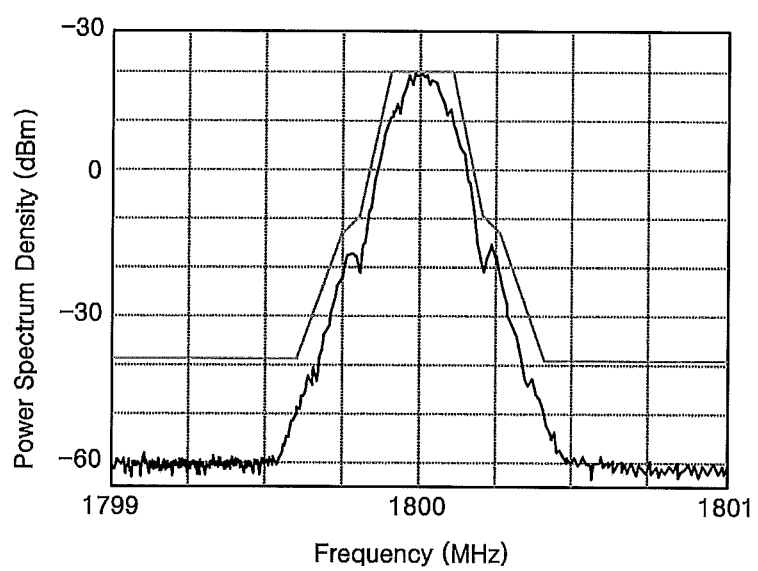
FIG. 9 is a graph showing output spectrum and emission mask of the class-E power amplifier in accordance with one example embodiment of the present invention.

FIG. 9 is a graph showing output spectrum and emission mask of the class-E power amplifier in accordance with one example embodiment of the present invention.

Since the class-E power amplifier is a switching power amplifier, constant envelope modulated signals are suitable. Accordingly, the output spectrum was measured by applying the GSMK modulated signal with BT=0.3 at the measurement test. By referring to FIG. 9, it can be found out that at the average output power of 31.5 dBm, the power amplifier satisfies the spectrum mask with 0.6% error vector magnitude (EVM). Furthermore, the suppressions of the second and the third harmonic are found to appear as −52 dBc and −29 dBc, respectively. As the power amplifier is differentially designed, the second harmonic is found out to have been clearly suppressed.

Figure 10:
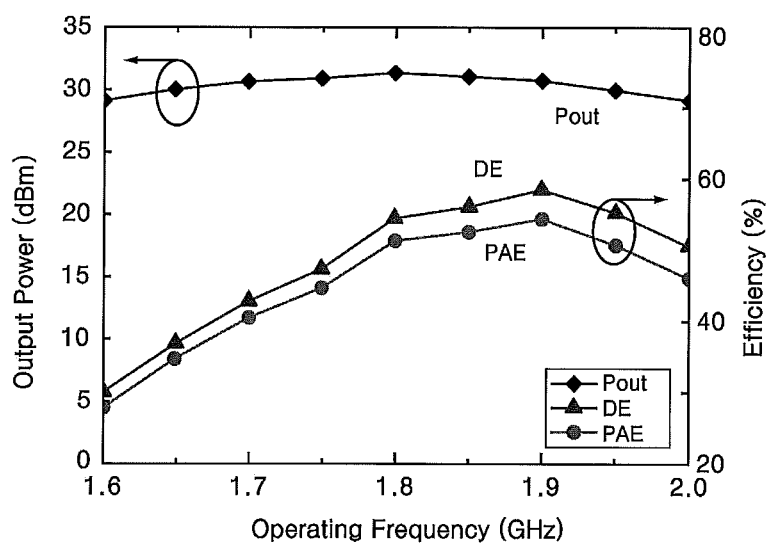
FIG. 10 is a graph illustrating drain efficiency, power added efficiency and output power of the class-E power amplifier against its operating frequency in accordance with one example embodiment of the present invention.

FIG. 10 illustrates drain efficiency, power added efficiency and output power of the class-E power amplifier against its operating frequency in accordance with one example embodiment of the present invention. The maximum output power was measured as 31.5 dBm at the operating frequency of 1.8 GHz and the maximum DE and the maximum PAE were measured as 58% and 54%, respectively, when the output power was 31 dBm at 1.9 GHz. Within the operating frequency between 1.6 GHz and 2.0 GHz, the output power was measured as 29 dBm.

Figure 11:
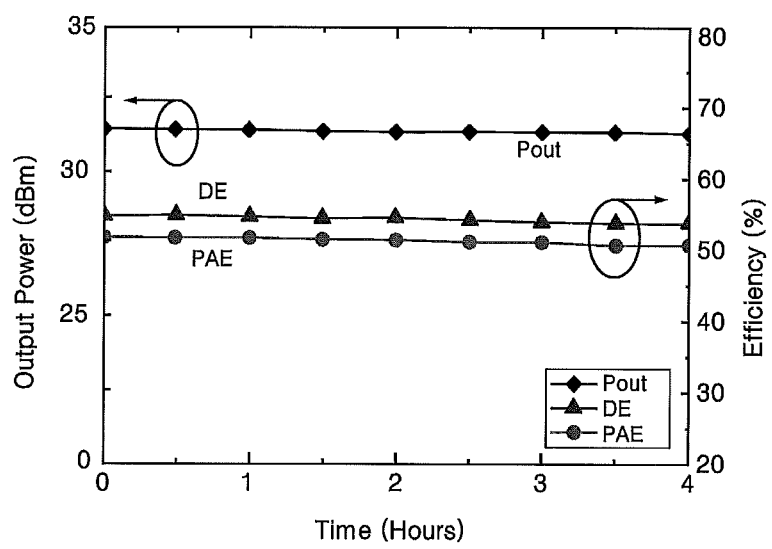
FIG. 11 is a graph representing reliability of the class-E power amplifier in cascode topology in accordance with one example embodiment of the present invention.

FIG. 11 is a graph representing reliability of the class-E power amplifier in cascode topology in accordance with one example embodiment of the present invention.

To measure reliability, the power amplifier was operated for four hours at the maximum output power. In addition, while the power supply voltage $V_{DD}$ was kept as 3.5V, the output power, the DE and the PAE were measured for four hours. As the result of the measurement during the four hours, the deterioration of the output power and efficiency was not observed. Furthermore, the output power after four hours was degraded only by 0.05 dB and the DE and the PAE fell by 0.7% and 0.8%, respectively.

Figure 12:
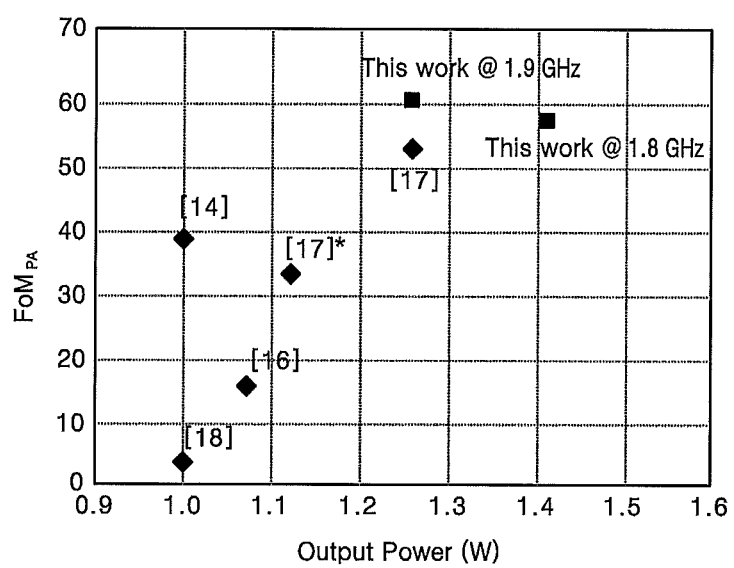
FIG. 12 is a graph comparing the performance of the CMOS class-E power amplifier in accordance with one example embodiment of the present invention with those of other CMOS power amplifiers according to conventional arts.

FIG. 12 compares the performance of the CMOS class-E power amplifier in accordance with one example embodiment of the present invention with those of other CMOS power amplifiers in accordance with one example embodiment of the present invention. Herein, the power amplifier is a watt-level CMOS power amplifier in the differential structure. For comparison, the figure of merit (FoM) introduced by the International Technology Roadmap for Semiconductor (ITRS) was used. The FoM is an index normalizing main performance such as output power $P_{out}$, PAE, output gain G and the square of operating frequency $f_0^2$. The FoM is expressed as shown below in Equation 10.

$$\text{FoM}_{PA} = P_{OUT} \cdot \text{PAE} \cdot G \cdot f_0^2 \qquad \text{Equation 10}$$

FIG. 12 shows the value of $\text{FoM}_{PA}$ depending on the maximum output. The points expressed in squares are the figures of merit of the class-E amplifier in accordance with the present invention at the operating frequencies of 1.8 GHz and 1.9 GHz, respectively and those expressed in diamond shapes show the figures of merit of the other class-E amplifiers. More concretely, the diamond shape expressed as [14] means the figure of merit of the CMOS class-E power amplifier introduced by K.-C. Tsai and P. R. Gray in the article of "A 1.9-GHz, 1-W CMOS Class-E power amplifier for wireless communications," IEEE J. Solid-State Circuit, vol. 34, pp. 962-970, July 1999. That written as [16] is the figure of merit of the CMOS power amplifier introduced by J. Jang, C. Park, H. Kim, and S. Hong in the article of "A CMOS RF power amplifier using an off-chip transmission line transformer with 62% PAE," IEEE Microwave and Wireless Components Letters, vol. 17, pp. 385-387, May 2007. Those as [17] and [17]* are the figure of merit of the CMOS power amplifier with and without output bulun introduced by R. Brama, L. Larcher, A. Mazzanti, and F. Svelto in the article "A 30.5 dBm 48% PAE CMOS class-E PA with integrated balun for RF applications," IEEE J. Solid-State Circuits. vol. 43, pp. 1755-1762, August 2008 while that as [18] shows the figure of merit of the CMOS class-E power amplifier introduced by K. L. R. Mertens and M. S. J. Steyaert in the article "A 700-MHz, 1-W fully differential CMOS class-E power amplifier," IEEE J. Solid-State Circuits, vol. 37, no. 2, pp. 137-141, January 2006. The explanation of the power amplifiers published in the aforementioned articles are omitted.

By referring to FIG. 12, it can be found out that the power amplifier in accordance with the present invention shows the higher figure of merit compared with any other power amplifiers.

As seen above, when the class-E differential amplifier in accordance with the present invention was implemented by using the 0.13 μm standard CMOS process, the output power of 31.5 dBm, the DE of 54% and the PAE of 51% were obtained at the operating frequency of 1.8 GHz. In addition, it can be found out that even the long-term operation at the maximum output does not result in degradation. In accordance with the present invention, the class-E power amplifier using the CMOS technology may prevent breakdown and reduce voltage stress on the CMOS transistor.

In accordance with the present invention, as the voltage stress is reduced on the CMOS class-E power amplifier, the application of the high power supply voltage may be allowed and therefore the load impedance may be high while the same efficiency is maintained.

In accordance with the present invention, due to the application of the differential structure, the CMOS class-E power amplifier may deliver higher output power than in the single-ended structure and may minimize interference in operation.

While the invention has been shown and described with respect to the preferred embodiments, it will be understood by those skilled in the art that various changes and modification may be made without departing from the spirit and scope of the invention as defined in the following claims.

Accordingly, the thought of the present invention must not be confined to the explained embodiments, and the following patent claims as well as everything including variation equal or equivalent to the patent claims pertain to the category of the thought of the present invention.

What is claimed is:

1. A class-E power amplifier, comprising a driver stage (DS) including a first power amplifier with transistors, to which an input signal is inputted; a main stage (MS), including a second power amplifier with transistors, whose input is connected to the output of the DS; and a first LC resonator whose one end is connected to the output of the DS and the other end to the ground as an AC equivalent circuit and a second LC resonator whose one end is connected to the input of the MS and the other end to the ground as an AC equivalent circuit, wherein the first LC resonator includes an inductor and a capacitor connected in series with each other, wherein the AC equivalent circuit of the second LC resonator includes an inductor whose one end is connected to the input of the main stage and the other end is to the ground and a capacitance component, connected in series with the inductor, viewed from the inductor to the MS.

2. The class-E power amplifier of claim 1, wherein the first LC resonator blocks even-numbered harmonics and penetrates odd-numbered harmonics to the main stage during the operation.

3. The class-E power amplifier of claim 1, further comprising a DC block part, disposed between the one end of the first LC resonator and the one end of the second LC resonator, which includes a capacitor.

4. The class-E power amplifier of claim 1, wherein the second LC resonator resonates at fundamental frequency during the operation.

5. The class-E power amplifier of claim 1, wherein the main stage includes one or more cascode structures including a common gate transistor and a common source transistor.

6. The class-E power amplifier of claim 5, wherein the one or more cascode structures form differential structures.

7. The class-E power amplifier of claim 5, wherein an output signal of the DS is inputted to a gate of the common source transistor.

8. The class-E power amplifier of claim 5, wherein the CG transistor includes a transistor having a thicker oxide gate compared to that of the common source transistor.

9. The class-E power amplifier of claim 5, further comprising a negative capacitance component which is connected between a drain and a source of the CG transistor and sets off parasitic capacitance occurring between those of the CS transistor due to the gate widths of the transistor.

10. The class-E power amplifier of claim 9, wherein, when the value of the negative capacitance is Cn, the negative capacitance is connected in parallel with the parasitic capacitance and becomes equivalent to Miller capacitance with a value of capacitance of (1−K)Cn where K is a gain of the CG transistor and the absolute value of (1−K)Cn is substantially same to the parasitic capacitance.

11. The class-E power amplifier of claim 1, wherein the DS includes one or more cascode structures including the CG transistor and the CS transistor.

12. The class-E power amplifier of claim 11, wherein the one or more cascode structures form a differential structure.

13. The class-E power amplifier of claim 11, wherein the input signal thereof is inputted to a gate of the CS transistor.

14. The class-E power amplifier of claim 13, wherein an input balun is formed on the gate of the CS transistor.

15. The class-E power amplifier of claim 14, wherein the input balun inputs the input signal to the gate of the CS transistor included in the one or more cascode structures by changing its structure from single-ended to differential.

* * * * *